US007139627B2

(12) United States Patent
Obara et al.

(10) Patent No.: US 7,139,627 B2
(45) Date of Patent: Nov. 21, 2006

(54) CALIBRATION OF PLURAL PROCESSING SYSTEMS

(75) Inventors: Asami Obara, Tokyo-To (JP); Yuichi Takenaga, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/487,973

(22) PCT Filed: Aug. 28, 2002

(86) PCT No.: PCT/JP02/08687

§ 371 (c)(1),
(2), (4) Date: Feb. 27, 2004

(87) PCT Pub. No.: WO03/021646

PCT Pub. Date: Mar. 13, 2003

(65) Prior Publication Data

US 2004/0215365 A1 Oct. 28, 2004

(30) Foreign Application Priority Data

Aug. 28, 2001 (JP) .............................. 2001-258024

(51) Int. Cl.
*G06F 19/00* (2006.01)
(52) U.S. Cl. .............................. 700/96; 700/19; 702/99
(58) Field of Classification Search ................ 700/19, 700/20, 71, 96, 117, 121; 702/99
See application file for complete search history.

(56) References Cited

U.S. PATENT DOCUMENTS

| 5,408,405 | A | * | 4/1995 | Mozumder et al. ........... 700/31 |
| 5,655,110 | A | | 8/1997 | Krivokapic et al. |
| 5,867,389 | A | | 2/1999 | Hamada et al. |
| 5,943,230 | A | * | 8/1999 | Rinnen et al. ................ 700/18 |
| 6,110,214 | A | | 8/2000 | Klimasauskas |
| 6,161,054 | A | * | 12/2000 | Rosenthal et al. .......... 700/121 |
| 6,275,750 | B1 | * | 8/2001 | Uchida et al. .............. 700/300 |
| 6,424,880 | B1 | * | 7/2002 | Goder et al. ................ 700/121 |
| 6,484,064 | B1 | * | 11/2002 | Campbell .................... 700/100 |

(Continued)

FOREIGN PATENT DOCUMENTS

DE          19838469          3/2000

(Continued)

OTHER PUBLICATIONS

International Preliminary Examination Report (PCT/IPEA/409) (translated) issued for PCT/JP2002/008687.

(Continued)

*Primary Examiner*—Leo Picard
*Assistant Examiner*—Alexander Kosowski
(74) *Attorney, Agent, or Firm*—Smith, Gambrell & Russell, LLP

(57) ABSTRACT

Plural processing apparatuses 3 such as CVD apparatuses 31 and diffusion apparatuses 33, measuring apparatuses 5, and a control computer 7 for management are connected through a LAN 9. Each processing apparatuses 3 stores control data for performing a treatment. The control computer 7 also stores the control data for the processing apparatuses 3. The control computer 7 makes each processing apparatus perform a treatment for calibration. The control computer 7 receives a result of the treatment performed by the processing apparatus 3 to be calibrated, and calibrates the control data stored in the control computer 7 based on the treatment result. The control computer sends the calibrated control data to the processing apparatus 3 after completion of the calibration procedure. The processing apparatus 3 stores the calibrated control data, which is used for subsequently performed treatment.

7 Claims, 13 Drawing Sheets

U.S. PATENT DOCUMENTS

| | | |
|---|---|---|
| 6,622,104 B1 * | 9/2003 | Wang et al. .................. 702/99 |
| 6,721,616 B1 * | 4/2004 | Ryskoski .................... 700/108 |
| 6,732,007 B1 * | 5/2004 | Pasadyn et al. ............. 700/121 |
| 2002/0107599 A1 * | 8/2002 | Patel et al. ................... 700/99 |
| 2003/0040830 A1 * | 2/2003 | Parikh et al. ............... 700/121 |
| 2003/0097198 A1 * | 5/2003 | Sonderman et al. ........ 700/110 |

FOREIGN PATENT DOCUMENTS

| | | |
|---|---|---|
| JP | 09-129529 | 5/1997 |
| JP | 2001-189249 | 7/2001 |

OTHER PUBLICATIONS

Notification of Transmittal of Copies of Translation of the International Preliminary Examination Report (PCT/IB/338) issued for PCT/JP2002/008687.

Search Report issued in EU Patent Application No. 02762897.3 dated Feb. 20, 2006.

* cited by examiner

MANAGEMENT TABLE FOR CVD APPARATUS

| APPARATUS ID | TOTAL NUMBER OF TREATMENTS | NUMBER OF TREATMENTS AFTER MODEL CALIBRATION | MODEL | NUMBER OF TREATMENTS AFTER RECIPE CALIBRATION | RECIPE | TARGET FILM THICKNESS | OTHERS |
|---|---|---|---|---|---|---|---|
| CVD 1 | 432 | 3 | *※@§ | 7 | *♭‡$# | 234nm | ⋯ |
| CVD 2 | 123 | 7 | #*※+§ | 5 | ・♭$¥* | 234nm | ⋯ |
| CVD 3 | 224 | 11 | *※@§* | 2 | *♭‡#↑ | 234nm | ⋯ |
| ⋯ | ⋯ | ⋯ | ⋯ | ⋯ | ⋯ | ⋯ | ⋯ |
| | | BASIC MODEL | | | BASIC RECIPE | | |

FIG. 7

CALIBRATION OF PLURAL PROCESSING SYSTEMS

TECHNICAL FIELD

The present invention relates to a control system and a control method for processing apparatuses that treat objects such as semiconductor wafers, more particularly, to a control system and a control method capable of unified management of plural processing apparatuses.

BACKGROUND OF THE INVENTION

Semiconductor processing apparatuses are used for performing various kinds of treatments, such as a film deposition on a surface of a semiconductor wafer and a dopant diffusion. Processing apparatuses of a stand-alone type have been primarily used. In a factory equipped with plural processing apparatuses of the stand-alone type, the processing apparatuses are independently controlled based on a control program and control data stored in each processing apparatus. The maintenance of the processing apparatuses is carried out one by one.

A control computer connected to plural processing apparatuses through a network to control the apparatuses is known. However, the computer merely gives instructions to the processing apparatuses.

Therefore, each processing apparatus must be provided with a controller having a high computing power, resulting in increase in a cost of each apparatus. In addition, the controller of the semiconductor processing apparatus is in need of periodic maintenance (specifically, calibration). Such maintenance must be done separately for each apparatus, and thus is time-consuming.

DISCLOSURE OF THE INVENTION

The present invention has been made in view of the aforementioned circumstances, and therefore the object of the present invention is to control plural processing apparatuses effectively.

The second object of the present invention is to lighten the load of control means of each processing apparatus to simplify the structure of the control means, thereby to reduce overall cost for making and operating the processing system including plural processing apparatuses.

In order to attain the objectives, according to the present invention, a part of computing functions, which is possessed by the control means of the conventional processing apparatus and needs a high computing power, is assigned to the control computer arranged separately from the processing apparatuses, thereby lightening the loads on each processing apparatus.

Accordingly, the present invention provides a processing system including: a plurality of processing apparatuses each including treatment means for treating an object, memory means for storing control data for controlling the treatment means, and control means for controlling the treatment means according to the control data; and a computer arranged separately from the processing apparatuses and adapted to communicate data including the control data with the processing apparatuses through a communication medium, the computer including calibration means for calibrating the control data for controlling each of the processing apparatuses based on a result of a treatment of the object performed by each of the processing apparatuses inputted into the computer.

In one preferred embodiment, the control means of each of the processing apparatuses is configured to receive the control data calibrated by the calibration means of the computer through the communication medium, configured to store the calibrated control data in the memory means, and configured to perform a treatment according to the calibrated control data.

In one preferred embodiment, the computer includes memory means for storing control data corresponding to each of the control data stored in the memory means of each of the processing apparatuses; and the computer is configured to perform a procedure, when calibrating the control data for one of the processing apparatuses, the procedure including the steps of: retrieving the control data for said one of the processing apparatuses stored in the memory means of the computer; calibrating the retrieved control data based on a result of a process of the object performed by said one of the processing apparatuses; storing the calibrated control data in the memory means of the computer; and sending the calibrated control data to said one of the processing apparatuses through the communication medium, and making the memory means of said one of the processing apparatuses store the calibrated data.

In one preferred embodiment, the processing system further includes a measuring apparatus adapted to measure a result of a treatment performed by the processing apparatus, the computer is configured to communicate data with the measuring apparatus through the communication medium, whereby the result of the treatment is inputted into the computer through the communication medium.

In one preferred embodiment, the treatment means of each of the processing apparatuses includes a heating furnace adapted to heat the object contained therein, and a plurality of thermal sensors arranged at the heating furnace; the control data includes a model for estimating temperature of the object based on outputs of the thermal sensors, and a recipe defining change in temperature of the object during the treatment; the memory means of each of the processing apparatuses is configured to store the model and the recipe; and the control means of each of the processing apparatuses is configured to estimate the temperature of the object in the heating furnace based on the outputs of the thermal sensors by using the model stored in the memory means, and configured to control the heating furnace based on the estimated temperature so that the temperature of the object will coincide with a temperature defined by the recipe stored in the memory means.

In one preferred embodiment, the computer is configured to perform a procedure, when calibrating the model for one of the processing apparatuses, the procedure including the steps of: sending a recipe for calibrating the model to said one of the processing apparatuses; making said one of the processing apparatuses perform a treatment of the object according to the recipe for calibrating the model; and calibrating the model by the calibration means based on a result of the treatment of the object.

In one preferred embodiment, the computer is configured to correct the model based on a measurement of an actual temperature of the object during the treatment being performed.

In one preferred embodiment, each of the processing apparatuses is configured to send a notification of a completion of the treatment of the object to the computer; and the computer is configured to count the number of treatments performed by each of the processing apparatuses according to the notification, and configured to calibrate the control data at every time when a designated number of treatments has been performed by each of the processing apparatuses after last calibration of the control data.

In one preferred embodiment, the processing apparatus has means for requesting the computer to perform a data processing; the computer includes means for performing the data processing in response to a request received from the processing apparatus, and for sending a result of the data processing to the processing apparatus; and the processing apparatus includes means for receiving the result of the data processing sent from the computer, and for operating according to the result of the data processing thus received.

In one preferred embodiment, each of the processing apparatuses includes measuring means for measuring a result of a treatment of the object performed by each of the processing apparatuses, and wherein a result of a measurement by the measuring means is capable of being sent from each of the processing apparatuses to the computer through the communication medium.

BRIEF DESCRIPTION OF THE DRAWINGS

FIG. 7 is a table showing an example of a management table stored in an apparatus-DB (database) of FIG. 6;

DESCRIPTION OF PERFERRED EMBODIMENTS

Figure 1:
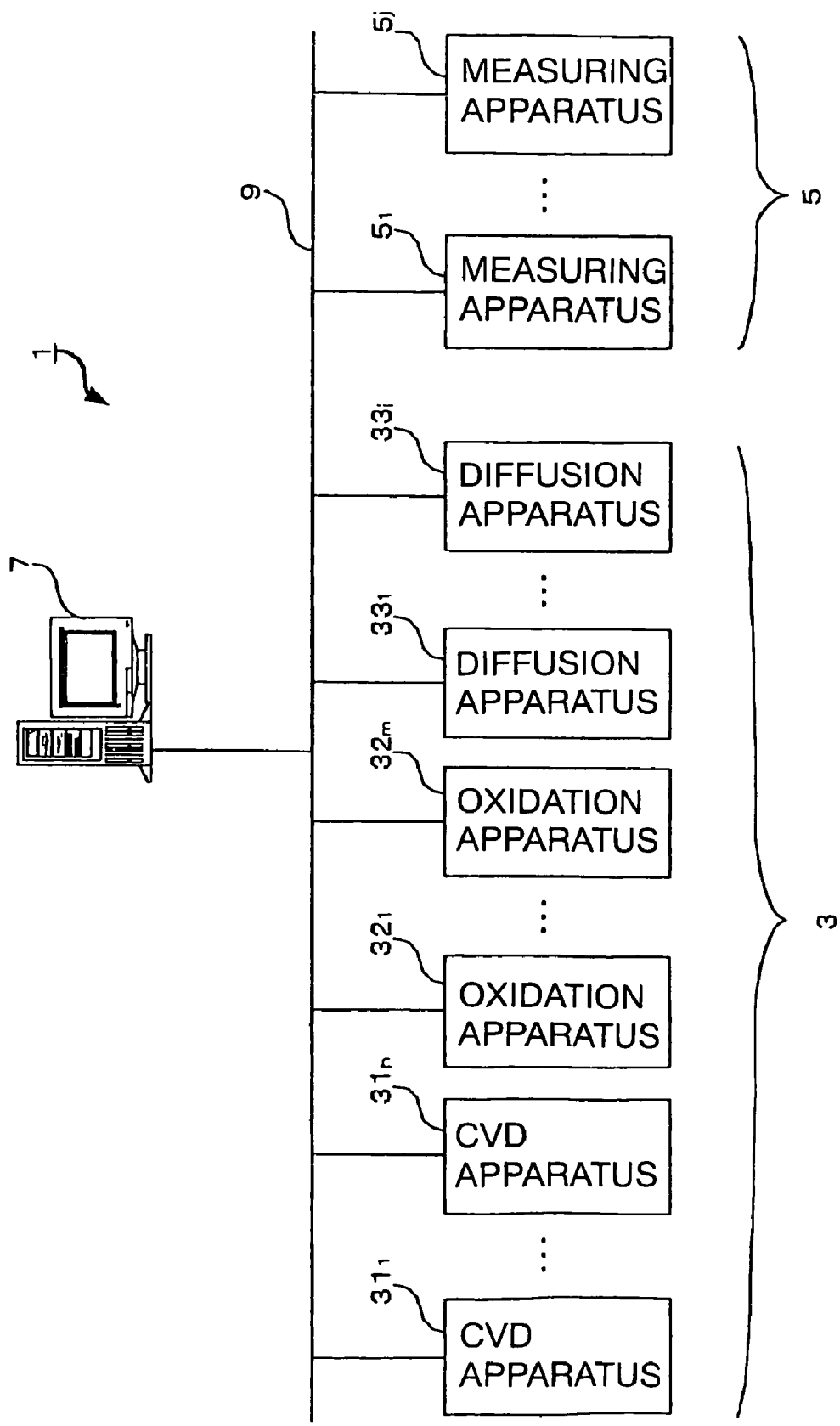
FIG. 1 is a diagram showing a structure of a processing system in one embodiment of the present invention.

A processing system 1 according to the present invention will be described below. As shown in FIG. 1, the processing system 1 is a semiconductor processing system, and is composed of a plurality of processing apparatuses 3, plural numbers (j) of measuring apparatuses ($5_1$ to $5_j$), a control computer 7, and a network (LAN) 9 adapted to interconnect these with each other. In a typical embodiment, the processing system is installed in a single building of a semiconductor device manufacturing factory. However, the control computer 7 may be installed in a separate space from the factory building.

Each of the processing apparatuses 3 includes plural numbers (n) of CVD (Chemical Vapor Deposition) apparatuses 31 ($31_1$ to $31_n$), plural numbers (m) of oxidation apparatuses ($32_1$ to $32_m$), and plural numbers (i) of diffusion apparatuses ($33_1$ to $33_i$). Each index of the reference numerals indicates the apparatus number.

Each of the CVD apparatuses 31 ($31_1$ to $31_n$) has substantially the same structure, and accommodates objects to be treated, such as semiconductor wafers, to perform a film-forming treatment on the objects by CVD. Each of the oxidation apparatuses 32 ($32_1$ to $32_m$) has substantially the same structure, and oxidizes surface areas of the objects such as semiconductor wafers. Each of the diffusion apparatuses 33 ($33_1$ to $33_i$) has substantially the same structure, and diffuses (dopes) impurities into the surface areas of the objects such as semiconductor wafers. Each of the measuring apparatuses 5 ($5_1$ to $5_j$) measures various numerical values representing the results of the treatment of the object, e.g., the thickness of a film formed on the object, and the concentration of a certain element included in the diffusion area.

The structure of the CVD apparatus 31 will be described with reference to FIG. 2. The CVD apparatus 31 is of a batch type. The CVD apparatus 31 includes a reaction tube 302 of a double-tube structure having an inner tube 302a and an outer tube 302b. A tubular metallic manifold 321 is disposed below the reaction tube 302.

In the reaction tube 302, a lot of, for example, 150 pieces of semiconductor wafers W (i.e., objects to be treated) are horizontally mounted on a wafer boat 323 while being vertically spaced at intervals. The wafer boat 323 is held on a cap 324 through a heat insulation tube 325.

Figure 3:
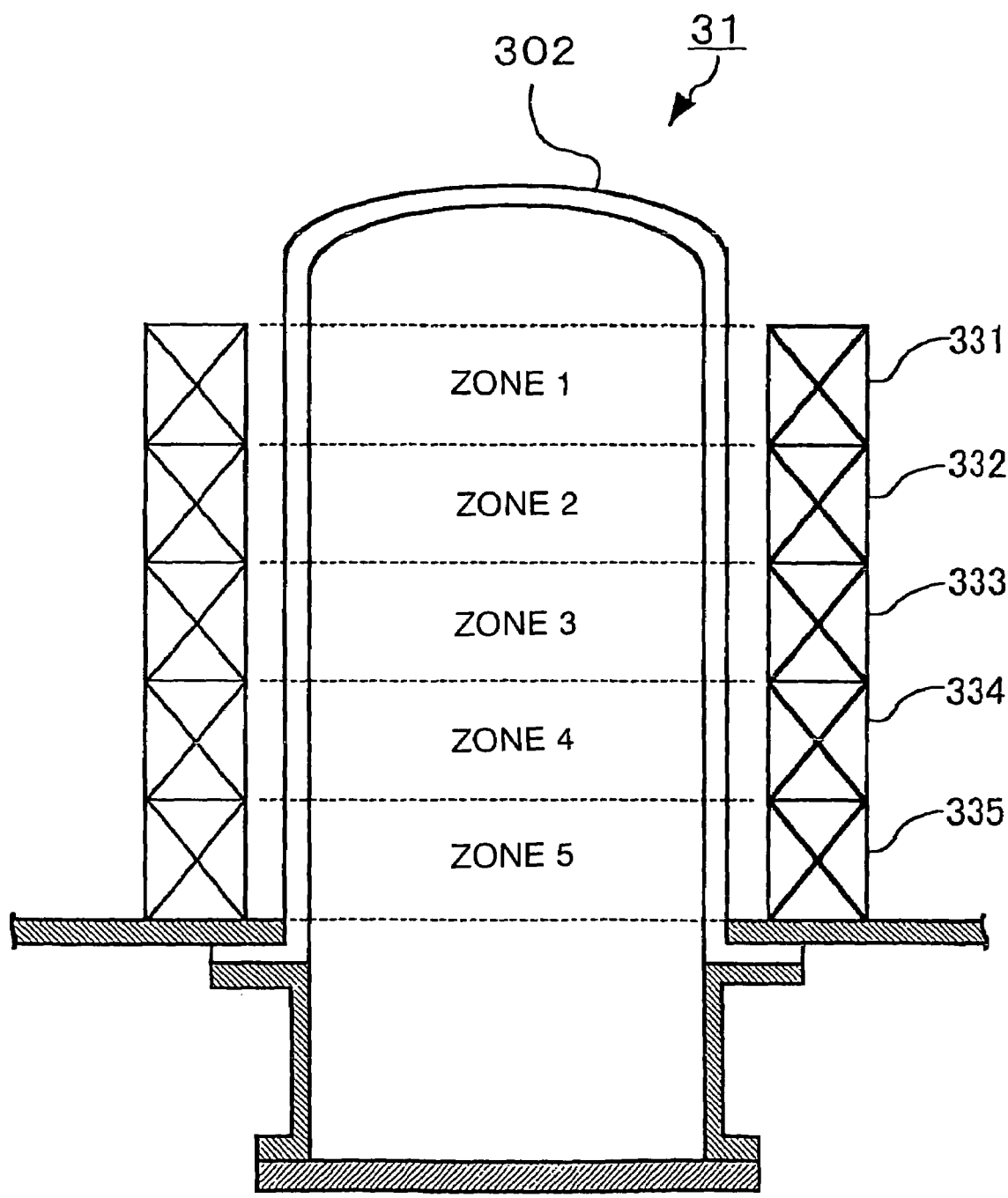
FIG. 3 is a drawing showing an arrangement of zones in a reaction tube.

Five heaters 331–335 are arranged at different vertical positions around the reaction tube 302. Power controllers 336–340 supply electric power to the heaters 331–335, respectively, to control the heaters 331–335 separately. The reaction tube 302, the manifold 321 and the heaters 331–335 constitute a heating furnace. As shown in FIG. 3, the reaction tube 302 is divided into five zones each corresponding to each heater 331–335.

Figure 2:
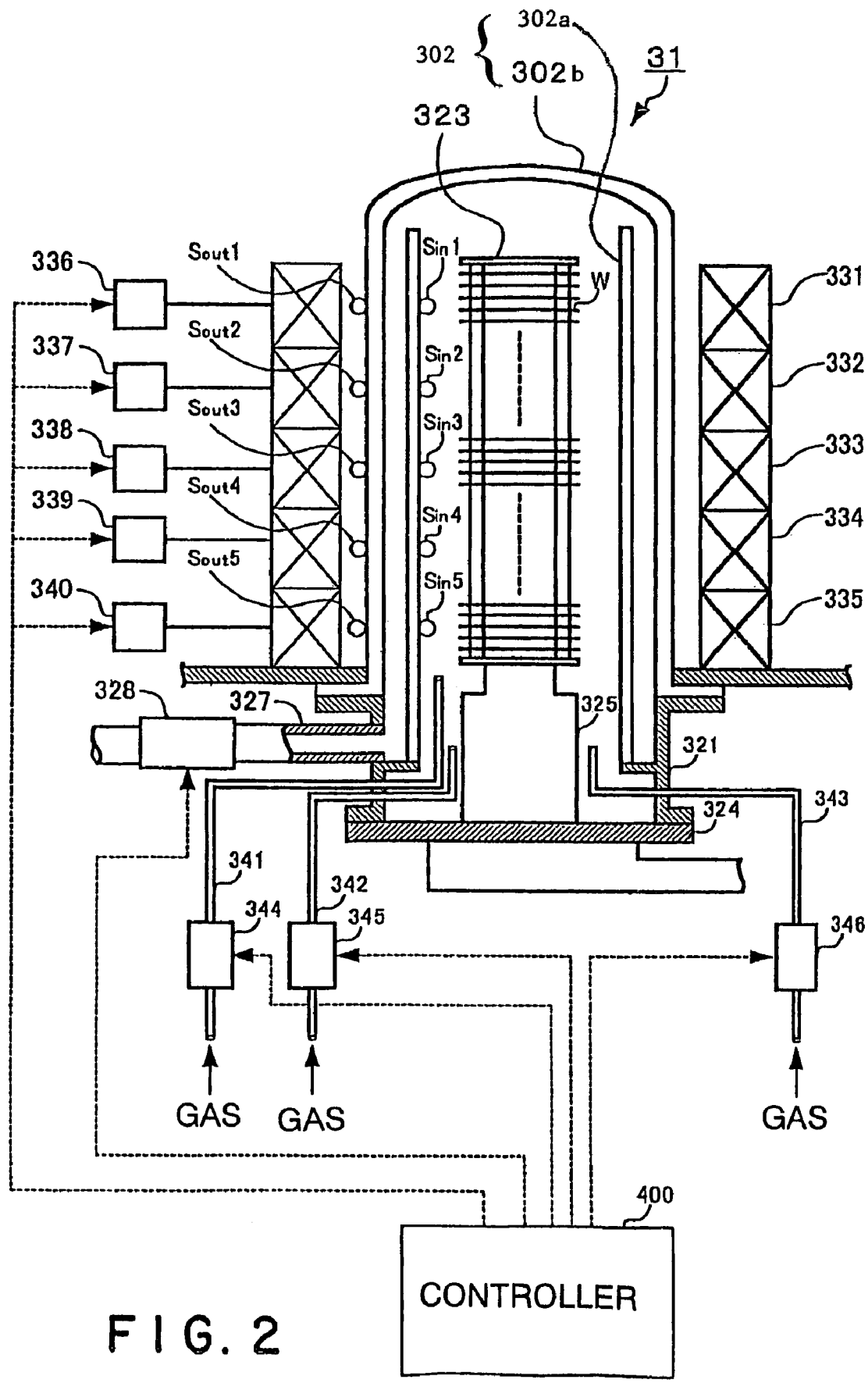
FIG. 2 is a drawing showing an example of a structure of a CVD apparatus shown in FIG. 1.

As shown in FIG. 2, the manifold 321 has three gas supply pipes 341, 342 and 343 for supplying gases into the inner tube 302a. Process gases (precursor gases) for film-forming, such as dichlorosilane, ammonia, and nitrogen, and a carrier gas are supplied to the gas supply tubes 341, 342, and 343, through mass flow controllers (MFC) 344, 345, and 346, respectively. An exhaust pipe 327 is connected to the manifold 321 for discharging gases in the reaction tube 302 through a gap between the inner tube 302a and the outer tube 302b. The exhaust pipe 327 is connected to a vacuum pump through a pressure regulating unit 328, etc.

Five thermal sensors (thermocouples) Sin1–Sin5 are vertically aligned on an inner surface of the inner tube 302a. Each thermal sensor Sin1–Sin5 is covered with a quartz pipe (not shown) in order to prevent metallic contamination of the wafers W. The thermal sensors Sin1–Sin5 are respectively arranged in the five zones shown in FIG. 3.

Five thermal sensors Sout1–Sout5 are vertically aligned on an outer surface of the outer tube 302b. The thermal sensors Sout1–Sout5 are also respectively arranged in the five zones shown in FIG. 3.

The CVD apparatus 31 has a controller 400 for controlling process parameters, such as temperature of process atmosphere, pressure and gas flow rate in the reaction tube 302. The controller 400 receives output signals of the thermal sensors Sin1–Sin5 and Sout1–Sout5, and outputs control signals to the power controllers 336–340 of the heaters 331–335, the pressure regulating unit 328 and the mass flow controllers 344–346.

Figure 4:
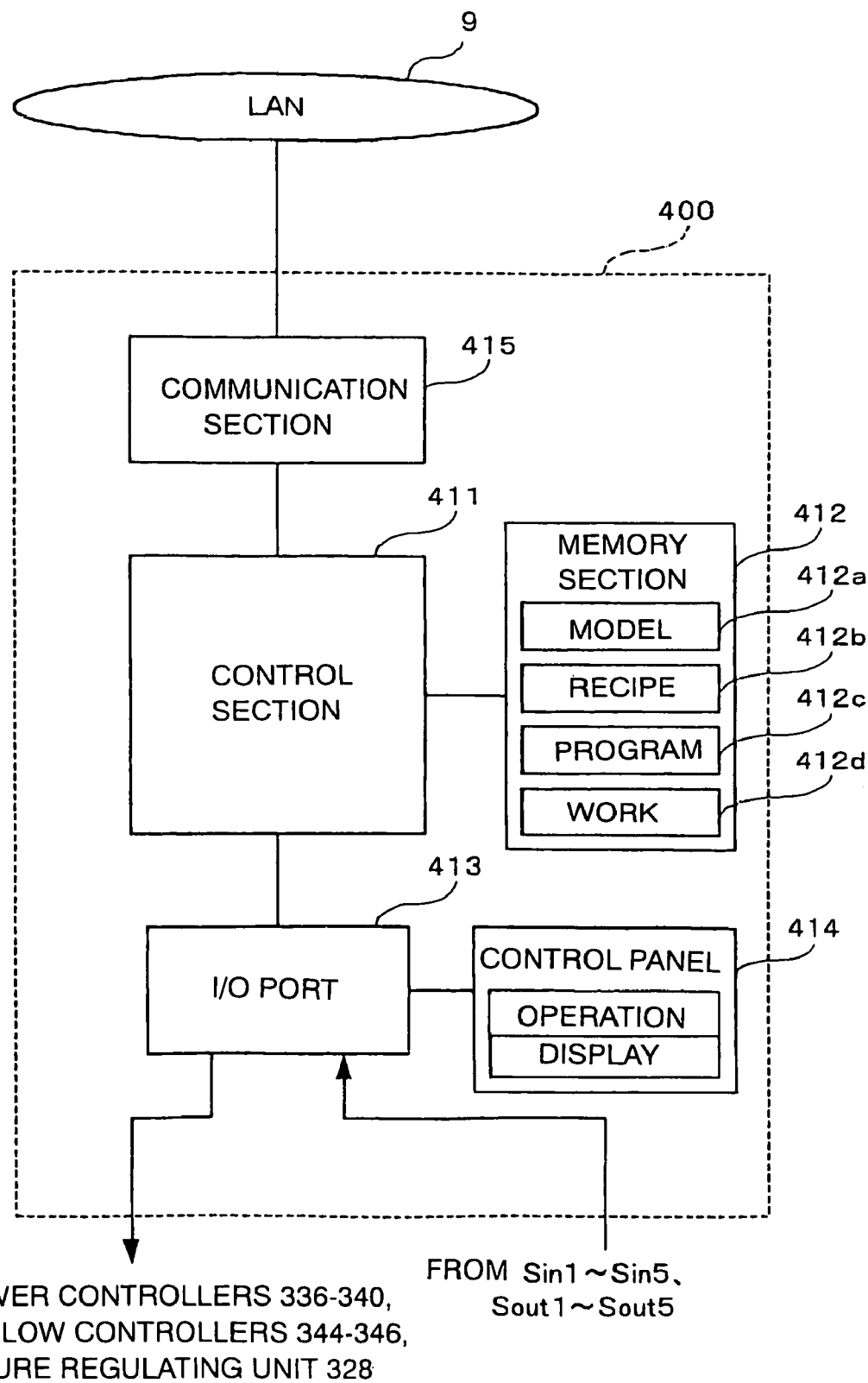
FIG. 4 is a block diagram showing an example of a structure of a controller shown in FIG. 2.

Details of the structure of the controller 400 will be described with reference to FIG. 4. The controller 400 includes a control section 411, a memory section 412, an I/O port 413, a control panel 414 and a communication section 415.

The memory section 412 is constituted by a RAM, a ROM, a flash memory, or a disk memory unit or the like. The memory section 412 includes a model storage section 412a, a recipe storage section 412b, a program storage section 412c, and a work area 412d.

The model storage section 412a stores a model (a mathematical model; a high-order, multidimensional function), which is configured to estimate (i.e., calculate) the temperatures of the wafers W placed in the respective zones based on the output signals (i.e., measured temperatures) of the thermal sensors Sin1–Sin5 and Sout1–Sout5, and the instruction values sent to the power controllers 336–340 (i.e., the values corresponding to electric power supplied by the power controllers 336–340 to the heaters 331–335), and is also configured to determine electric power to be supplied to the heaters 331–335 so that each estimated temperature coincides with a target value. Such a model is disclosed in, for example, U.S. Pat. No. 5,517,594, and can be used herein.

Figure 5:
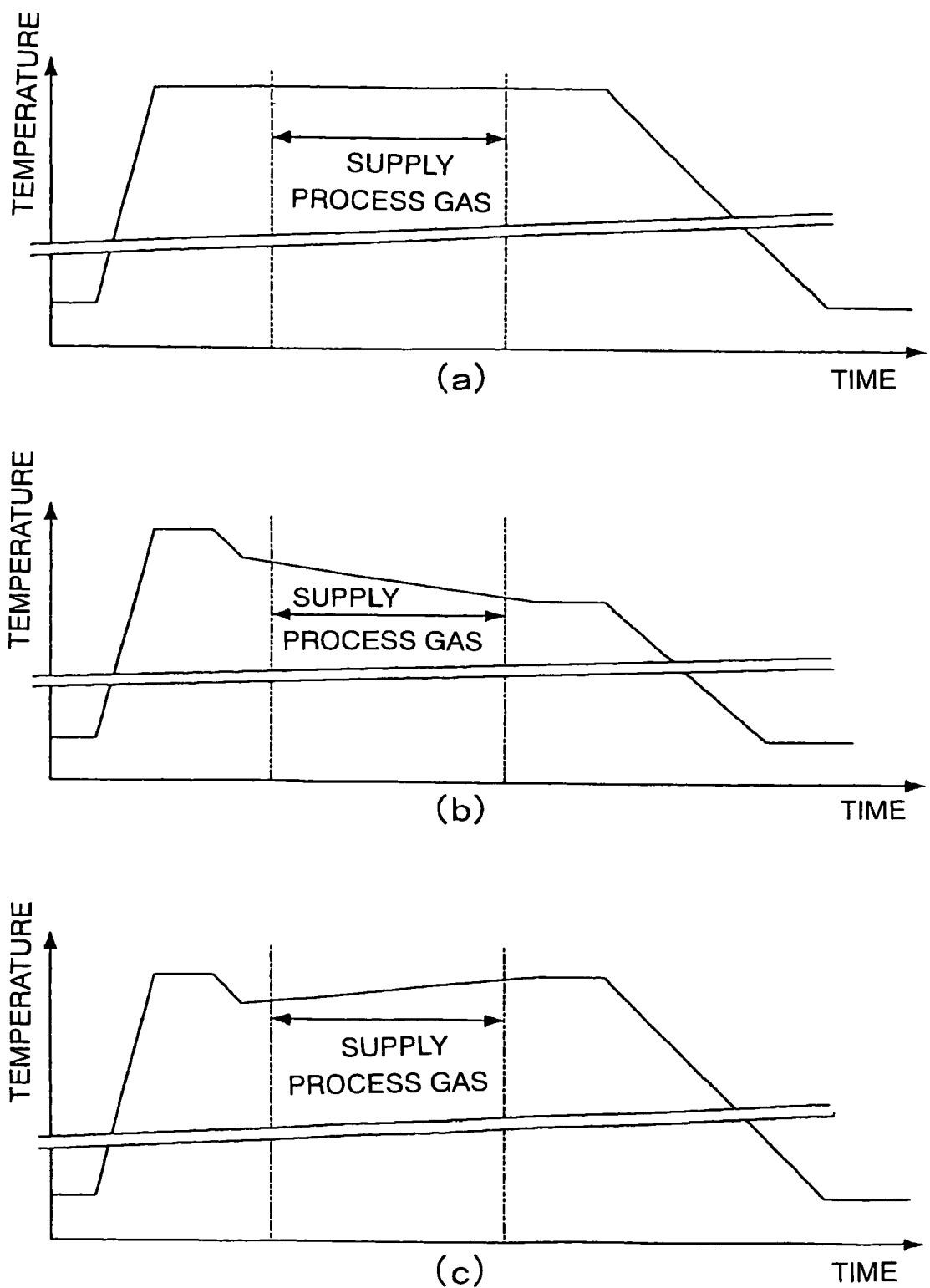
FIG. 5 shows examples of temperature recipes.

The recipe storage section 412b stores process recipes defining treatment procedures for different sorts of the film-forming treatments performed by each CVD apparatus 31. Each process recipe includes a temperature recipe which defines a desired temperature change to which the wafers W to be processed is subjected. The temperature recipes can be expressed by temperature-time curves as shown in FIGS. 5(a) to 5(c). In a conventional processing apparatus of a batch type, a single temperature recipe is prepared for all the wafers W. However, in this embodiment, previously coordinated temperature recipes are prepared for every zone shown in FIG. 3, so that the treatment achieves in-plane uniformity in each wafer W and uniformity between the wafers W.

FIG. 5(a) shows an example of the temperature recipe for performing a film-forming treatment while maintaining the temperature of the wafers W constant. FIG. 5(b) shows an example of a temperature recipe for performing a film-forming treatment while lowering the temperature of the wafers W. FIG. 5(c) shows an example of a temperature recipe for performing a film-forming treatment while raising the temperature of the wafers W. In the event that the film-forming treatment is performed while maintaining the temperature of the wafer W constant in accordance with the recipe shown in FIG. 5(a), the film-forming treatment is carried out while achieving uniform temperature on the entire surface of the wafer W. In the event that the film-forming treatment is performed while lowering the temperature of the wafer W in accordance with the recipe shown in FIG. 5(b), the film-forming process is carried out with the temperature of the center portion of the wafer W being higher than that of the peripheral portion of the wafer W. In the event that the film-forming treatment is performed while raising the temperature of the wafer W in accordance with the recipe shown in FIG. 5(c), the film-forming treatment is carried out with the temperature of the center portion of the wafer W being lower than that of the peripheral portion of the wafer W.

The program storage section 412c stores programs such as an operation control program for the control section 411. The work area 412d functions as a work area or the like of the control section 411.

The I/O port 413 supplies signals measured by the thermal sensors Sin1–Sin5 and Sout1–Sout5 to the control section 411, and outputs control signals outputted by the control section 411 to the power controllers 336–340, the mass flow controllers 344–346 and the pressure regulating unit 328, etc. The control panel 414 is connected to the I/O port 413. The control panel 414 includes a display section and an operating section, displays images provided by the control section 411, and gives instructions of the user to the control panel 411 through the I/O port 413.

The communication section 415 communicates data between the CVD apparatuses 31 and the control computer 7 through the LAN 9. The control section 411 has a processor to operate in accordance with the operation control program stored in the program storage section 412c. In a specific embodiment, the control section 411 obtains output values of the thermal sensors Sin1–Sin5 and Sout1–Sout5, and instruction values sent to the power controllers 336–340 (i.e., the values corresponding to the power supplied to the heaters 331–335), applies these values to the model stored in the model storage section 412a, and estimates the temperature of the wafer W in each zone at predetermined time intervals or at a substantially real time mode. The control section 411 instructs the power controllers 336–340 to control the electric power so that the estimated temperature coincides with the value specified by the temperature recipe stored in the recipe storage section 412b.

The control section 411 also gives instructions to the mass flow controllers 344–346 and the pressure regulating unit 328 to control starting and stopping of the supply of the precursor gases, flow rates of the precursor gases, pressure in the reaction tube 302, and so on, according to the process recipe.

The oxidation apparatuses 32 and the diffusion apparatuses 33 shown in FIG. 1 are also of a batch type. Similar to the CVD apparatus 31, each of the oxidation apparatus 32 and the diffusion apparatus 33 estimates the temperature of the wafers W based on values measured by the thermal sensors, and controls the heaters so that the estimated wafer temperature coincides with the temperature specified by the temperature recipe to perform a predetermined treatment.

The control computer 7 manages all the processing apparatuses 31–33 and all the measuring apparatuses 5, and performs control processes, such as a management of the number of runs of each apparatus, a renewal (fine-tuning) of the model, and a renewal of the recipe.

Figure 6:
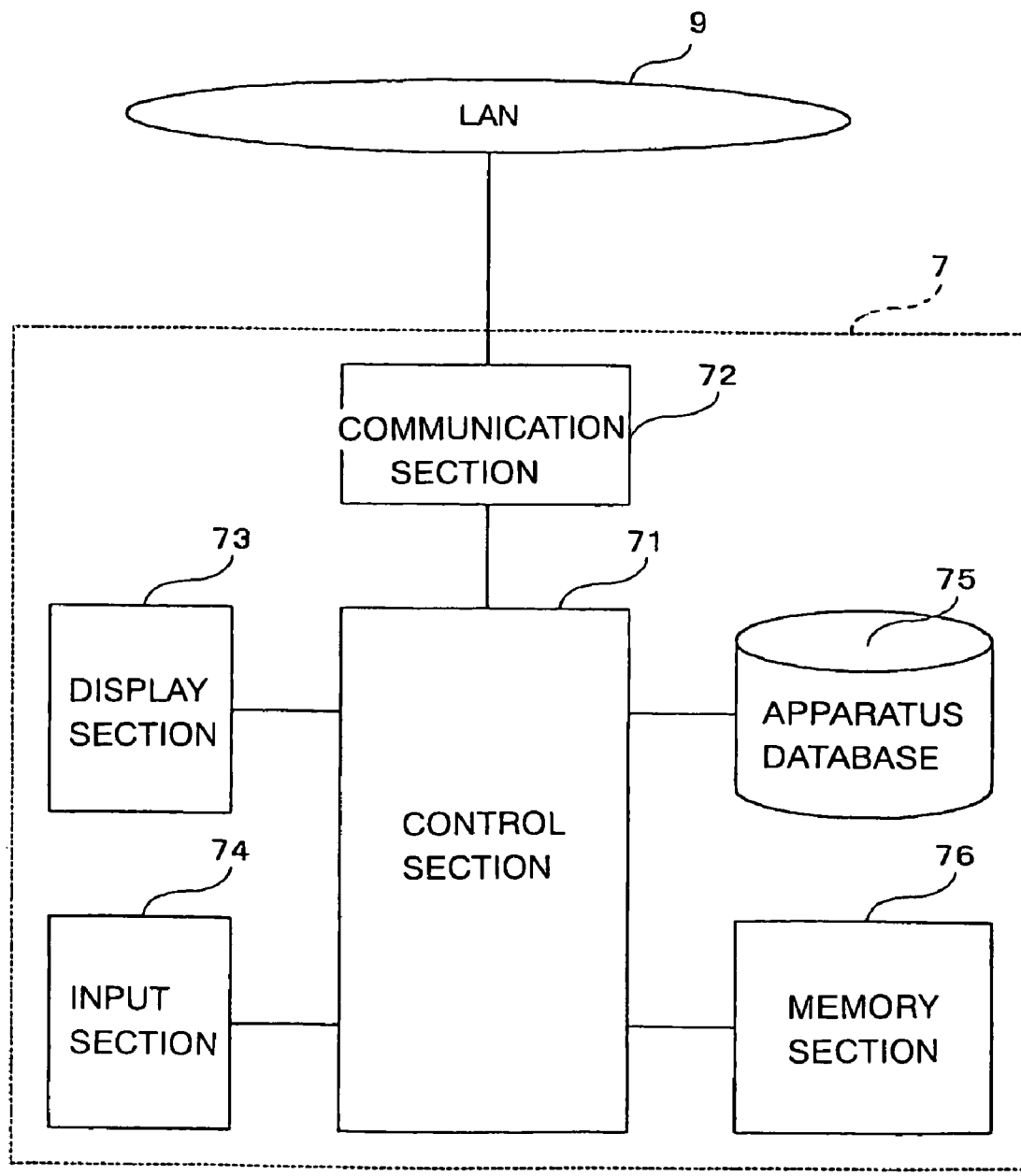
FIG. 6 is a block diagram showing an example of a structure of a control computer shown in FIG. 1.

An example of a structure of the control computer 7 will be described with reference to FIG. 6. The control computer 7 is composed of a control section 71, a communication section 72, a display section 73, an input section 74, an apparatus database (DB) 75, and a memory section 76.

The communication section 72 communicates data between the processing apparatuses 31–33 and the measuring apparatuses 5 through the LAN 9. The display section 73 shows various data relating to the control computer 7 to the user. The input section 74 inputs instructions from the user and data to the control section 71.

The apparatus-DB 75 comprises, for example, a hard disk device, and stores management tables in which data for managing the respective processing apparatuses of every sort are recorded. For example, as shown in FIG. 7, the data included in the management table for the CVD apparatuses 31 are: the apparatus-ID, the total number of treatments (i.e., the total number of treatments performed after the apparatus is installed); the number of treatments after the calibration of the model (i.e., the number of treatments after the last calibration of the model); the model (i.e., the model currently stored in the apparatus), the number of treatments after the calibration of the recipe (i.e., the number of treatments after the last calibration of the recipe); the recipe (i.e., the recipe currently stored in the apparatus); a target film thickness (i.e., a desired film thickness), and so on. In addition, the data in the management table includes a basic model commonly used by the CVD apparatuses (i.e., a basic model commonly used in the apparatuses of the same specifications) and a basic recipe commonly used by the CVD apparatuses (i.e., a common basic recipe for a film-forming process performed by the apparatuses of the same specifications under the same condition).

The memory section 76 stores an operation program, etc. of the control section 71, and functions as a work area of the control section 71.

The control section 71 operates according to a control program stored in the memory section 76, and manages the whole processing system 1. Especially in this embodiment, the control section 71 counts the number of treatments performed by each processing apparatus 31–33, and calibrates (corrects) the models and recipes of each apparatus for its proper operation every time when each apparatus has performed a designated number of treatments. Details of the calibration process will be described later.

Next, the operation of the processing system 1 will be described.

When each processing apparatus of the processing system 1 are designed, the basic model is designed based on the structure and the feature of the processing apparatus 3. The basic model is designed commonly to the apparatuses of the same design specifications, and does not reflect the differences in the actual structure between the apparatuses and the differences in operating environments where the respective apparatuses are used. Thus, when the basic model is used exactly as it is, the wafer temperature estimated by using the model may be different from the actual wafer temperature.

Similarly, when designing a process (treatment), a basic recipe defining treatment steps (processes) to be performed by each processing apparatus 3 is designed in order to obtain a desired treatment result (e.g., target film thickness, film quality, element concentration, and so on). The basic recipe is designed commonly to the apparatuses of the same design for performing the same treatment, and does not reflect differences in the structures and operation environments of the respective apparatuses. Thus, when the basic recipe is used exactly as it is, the manufactured film or layer may have a component, a thickness and an element concentration which are different from the desired ones.

Figure 8:
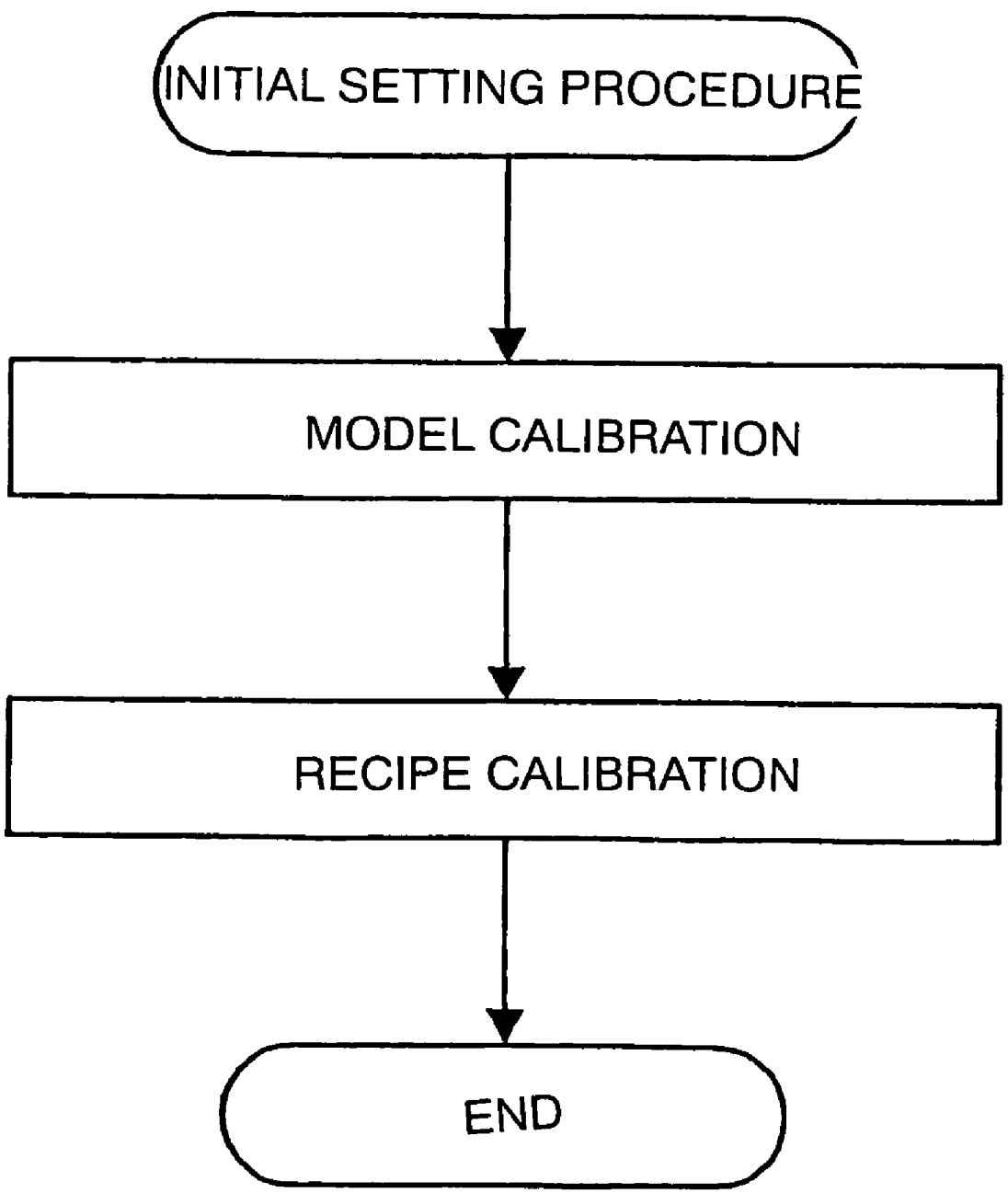
FIG. 8 is a chart showing calibration procedures at the initial setting of the processing system.

Therefore, as shown in FIG. 8, when the processing system 1 is installed (for example), the basic model and the basic recipe are sequentially calibrated (customized) for each of the processing apparatuses 3, so that the estimated wafer temperature coincides with the actual wafer temperature and that a desired treatment result is obtained.

The calibration of the CVD apparatuses 31 is described by way of example. As shown in FIG. 7, before calibration, the apparatus-ID of each CVD apparatus 31 is registered in the apparatus-DB 75 of the control computer 7. The basic model and the basic recipe are also registered in the apparatus-DB 75 as the model and the recipe for each CVD apparatus 31. Then, the total number of treatments, the number of treatments after the calibration of the model, and the number of treatments after the calibration of the recipe are set to be zero.

Next, the procedure for calibrating the model is described with reference to FIG. 9. The operator of the control computer 7 designates the apparatus-ID and the sort of apparatus of the CVD apparatus 31, and gives an instruction to start the calibration of the model.

In response to the instruction, the control part 7 retrieves a recipe exclusively used for calibrating the model from the memory section 76 (step S111). Then, the control section 71 sends an instruction for starting the model calibration and the recipe for calibration to the CVD apparatus 31 to be calibrated (step S112). The CVD apparatus 31 to be calibrated receives the instruction and the recipe for calibration from the control computer 7, and temporarily stores the received recipe for calibration in the recipe storage section 412*b* (step S113).

The person in charge of treatment loads the wafers W in a cassette, and places the cassette on a receiving section of the CVD apparatus 31. The control section 411 of the CVD apparatus 31 makes the apparatus transfer the wafers W onto the wafer boat 323, and then makes the apparatus place the wafer boat 323 on the heat insulation tube 325, in response to the instruction from the control computer 7.

Thereafter, the control section 411 makes the apparatus perform a treatment (process) according to the recipe for calibration stored in the recipe storage section 412*b* (step S114). Specifically, the control section 411 obtains the outputs of the thermal sensors Sin1–Sin5 and Sout1–Sout5, and the instruction values sent to the respective power controllers 336–340, in order to estimate the temperature of the wafer W in each zone based on the model (the basic model is used for the first time). The control section 411 then adjusts the instruction values to be sent to the respective power controllers 336–340 so that the estimated wafer temperature coincides with the temperature specified by the recipe for calibration. Then, the control section 411 makes the apparatus supply gases according to the recipe for calibration so as to perform a film-forming treatment.

When the film-forming treatment is completed (step S115), the control section 411 sends the control computer 7 a notification of the completion of the film-forming treatment (step S116). The control computer 7 receives the notification and waits for receiving a measured value from the measuring apparatuses 5 (step S117).

The person in charge of treatment takes the processed wafers W out of the CVD apparatus 31 (step S118), sets the wafers W in the respective zones in the measuring apparatus 5 (step S118), designates the apparatus-ID of the CVD apparatus 31, and measures the film thickness of the wafer W (step S119). The measuring apparatuses 5 send the measured film thickness with the apparatus-ID to the control computer 7 (step S119).

The control section 71 of the control computer 7 compares the measured film thickness sent from the measuring apparatuses 5 with the target film thickness which should be obtained under the condition defined by the recipe for calibration. Based on the comparison, the control section 71 calibrates the model for the CVD apparatus registered in the apparatus-DB 75 (step S121). Specifically, if the measured film thickness is smaller than the target film thickness, the current model is calibrated such that lower temperature is estimated by the model. On the other hand, if the measured film thickness is larger than the target film thickness, the current model is calibrated (customized) such that higher temperature is estimated by the model.

In this way, the film thickness obtained by the treatment performed according to the recipe for calibration is compared with the target film thickness, and the model is calibrated based on the difference in the film thickness between the former and the latter so that the model can estimate an appropriate temperature. The control section 71 writes the calibrated model in a column for the CVD apparatus 31 of the apparatus-DB 75, and sends the calibrated model to the CVD apparatus 31 to be calibrated (step S122). The CVD apparatus 31 receives the calibrated model and overwrites the same in the model storage section 412*a* (step S123).

By repeating the above calibration procedures of the control computer 7 and each of the CVD apparatuses 31 for a designated number of times, the basic model is tuned to reflect the characteristics of each apparatus. After the first calibration, the calibration is performed by using the model calibrated by the last calibration.

After the difference between the actual film thickness and the expected film thickness becomes less than a predetermined value, and after the designated number of calibration procedures are carried out, the calibration of the model is completed, and then the calibration (customization) of the recipe is started.

The calibration of the recipe will be described with reference to FIG. 10. The operator of the control computer 7 designates the apparatus to be calibrated, and instructs to start the calibration of the recipe. In response to the instruction, the control section 71 of the control computer 7 sends an instruction to the CVD apparatus 31 to be calibrated (step S211). The CVD apparatus 31 receives the instruction from the control computer 7 (step S212).

The person in charge of treatment loads the wafers W on a cassette, and places the cassette on the receiving part of the CVD apparatus 31. The CVD apparatus 31 transfers the wafers W onto the wafer boat 323, and then places the wafer boat 323 on the heat insulation tube 325.

Then, the CVD apparatus 31 performs a process according to the recipe (at the first time, the basic recipe is used) stored in the recipe storage section 412*b* (step S213). Specifically, the control section 411 obtains the outputs from the thermal sensors Sin1–Sin5 and Sout1–Sout5, and the instruction values sent to the respective power controllers 336 to 340, in order to estimate the temperature of the wafer W in each zone based on the model. The control section 411 then adjusts the instruction values to be sent to the respective power controllers 336–340 so that the estimated wafer temperature coincides with the temperature specified by the recipe. Then, the control section 411 makes the apparatus supply gases according to the recipe so as to perform a film-forming treatment.

When the film-forming treatment is completed (step S214), the control section 411 sends a notification of the completion of the film-forming treatment to the control computer 7 (step S215). The control computer 7 receives the notification and waits for receiving a measurement results relating to the processing apparatus (step S216).

Figure 11:
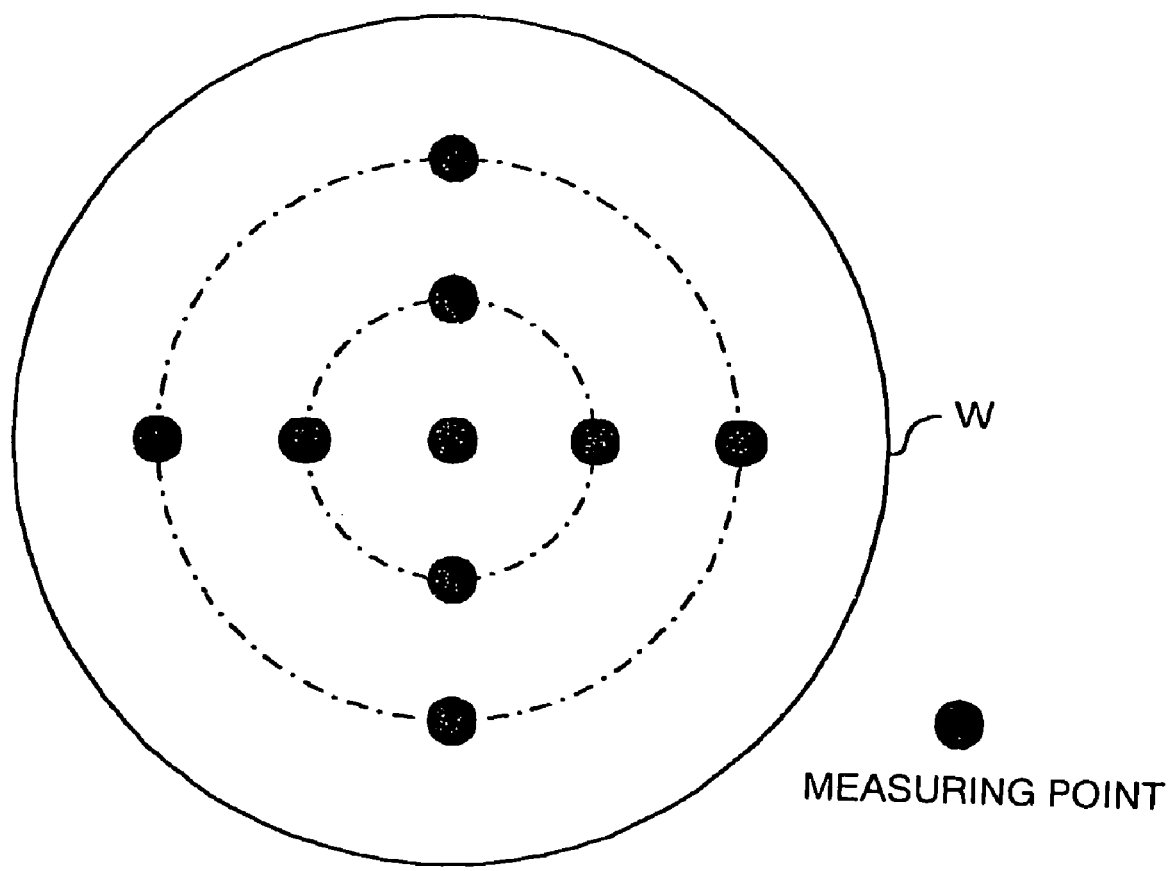
FIG. 11 shows measuring points on a wafer.

The person in charge of treatment takes the processed wafers W out of the CVD apparatus 31, sets the same in the measuring apparatuses 5, and inputs the apparatus-ID of the CVD apparatus 31. Wafers W are picked up from each of the five zones, and the film thickness is measured at a plurality of, e.g., nine locations for each wafer W, as shown in FIG. 11. The measuring apparatuses 5 send the measured film thickness with the inputted apparatus-ID of the CVD apparatus 31 to the control computer 7 (step S218).

The control section 71 of the control computer 7 receives the measured value and stores the same in the memory section 76 (step S219). Then, the control section 71 calibrates the recipe based on the measured value (step S220). Although the recipe may be calibrated by any given method, the following calibration procedure is performed in this embodiment.

First, an average film thickness of the wafers W picked up from the five zones is calculated, and the temperatures specified by all the recipes respectively assigned to the zones are corrected so that the average film thickness coincides with the target film thickness. For example, when the average film thickness is smaller than the target film thickness, the process temperature specified by the recipes for all the zones is increased. On the other hand, when the average film thickness is larger than the target film thickness, the process temperature specified by the recipes for all the zones is lowered.

Next, an average film thickness is calculated for each wafer W picked up form each zone, and the temperature specified by the recipe for each zone is corrected so that the average film thickness coincides with the target film thickness. For example, when the average film thickness of a wafer W picked up form one zone is smaller than the target film thickness, the process temperature specified by the recipe for the zone is increased. On the other hand, when the average film thickness is larger than the target film thickness, the process temperature specified by the recipe for the zone is lowered.

Third, the control section 71 corrects the recipe to reduce the in-plane ununiformity in the thickness of the film formed on the wafer W in each zones. As described above, with the apparatus structure shown in FIG. 2, the temperature is higher at the peripheral portion of the wafer W than at the center portion, when raising the temperature of the wafer W. On the other hand, the temperature is lower at the peripheral portion of the wafer W than at center portion, when lowering the temperature of the wafer W. In general, when performing a film-forming treatment, higher wafer temperature promotes the film-forming and thus results in a thicker film, if the process conditions other than the wafer temperature are equal.

In the event that the film formed on the wafer W picked up from one zone is of a concave (cup) shape, that is, the film is thicker at the peripheral portion of the wafer W and is thinner at the center portion, uniform film thickness can be achieved if the relative temperature at the peripheral portion of the wafer W is lower than that when the concave film is formed. To this end, the temperature change rate (gradient of the line during the supply of the process gases shown in FIG. 5) during a film-forming treatment (during the supply of process gases) is changed. For example, in the recipe shown in FIG. 5(*a*), the temperature recipe for the zone is corrected such that the gradient of the line during the supply of process gases is changed from zero to negative value. In the recipe shown in FIG. 5(*b*), the temperature recipe for the zone is corrected such that the gradient of the line during the supply of process gases is higher. In the recipe shown in FIG. 5(*c*), the temperature recipe for the zone is corrected such that the gradient of the line during the supply of process gases is lower. On the other hand, in the event that the film formed on the wafer W picked up from one zone is of a convex (cap) shape, that is, the film is thicker at the center portion of the wafer W and is thinner at the peripheral portion, uniform film thickness can be achieved if the relative temperature at the peripheral portion of the wafer W is higher than that when the convex film is formed. To this end, the aforementioned correction in the temperature change rate should be reversed.

In this manner, the control section 71 corrects or calibrates the recipe currently stored in the CVD apparatus 31 to be calibrated. The control section 71 overwrites the calibrated recipe in a recipe storage area for the corresponding CVD apparatus 31 of the apparatus-DB 75, and sends the calibrated recipe to the CVD apparatus 31 to be calibrated (step S221). The control section 411 of the CVD apparatus 31 receives the calibrated recipe and overwrites the same in the recipe storage section 412*b* (step S222).

By repeating the calibration of the recipe for plural times, the basic recipe common to all the CVD apparatuses 31 can be tuned to reflect the characteristics of each apparatus. After the first calibration, the calibration is performed by using the recipe calibrated by the last calibration.

After the difference between the film thickness thus formed and the expected film thickness becomes less than a predetermined value, and after the designated number of calibration procedures are repeated, the control section 71 completes the calibration of the recipe, informs the operator of the completion of the calibration of the recipe via the display section 73, and informs the calibrated processing apparatus 3 of the completion of the calibration of the recipe through the LAN 9. The processing apparatus 3 displays the completion of the calibration on the control panel 414 to inform the person in charge of treatment of the completion of the calibration. Thus, the calibration procedures in the initial setting are completed. Thereafter, the CVD apparatus 31 performs a normal operation (e.g., film-forming treatment on the product wafer).

The above-described calibration can be performed for the plural processing apparatuses 3 in parallel. In the case where a new processing apparatus 3 is added to the processing system 1 shown in FIG. 1, the calibration is performed only for the newly added processing apparatus 3. At this time, other processing apparatuses 3 can perform a normal operation.

The operation of the processing system 1 when each processing apparatus 3 performs a normal operation will be described with reference to FIG. 12. During the normal operation, upon a completion of one treatment, the control section 411 of each processing apparatus 3 sends a notification of the completion of the treatment to the control computer 7.

In response to the notification of the completion of the treatment, the control section 71 of the control computer 7 adds "one" to the total number of treatments performed by the apparatus, adds "one" to the number of treatments performed by the apparatus after the calibration of the model, and adds "one" to the number of treatments performed by the apparatus after calibration of the recipe, each "number of treatments" being stored in the management table (FIG. 6) of the apparatus-DB 75 (step S21). Then, the control section 71 judges whether or not the number of treatments after the calibration of the model reaches a previously determined value (e.g., 13 times) (step S22).

If it reaches the previously determined value, the control section 71 judges that the model of the processing apparatus must be calibrated, and informs the operator of the fact through the display section 73.

Figure 9:
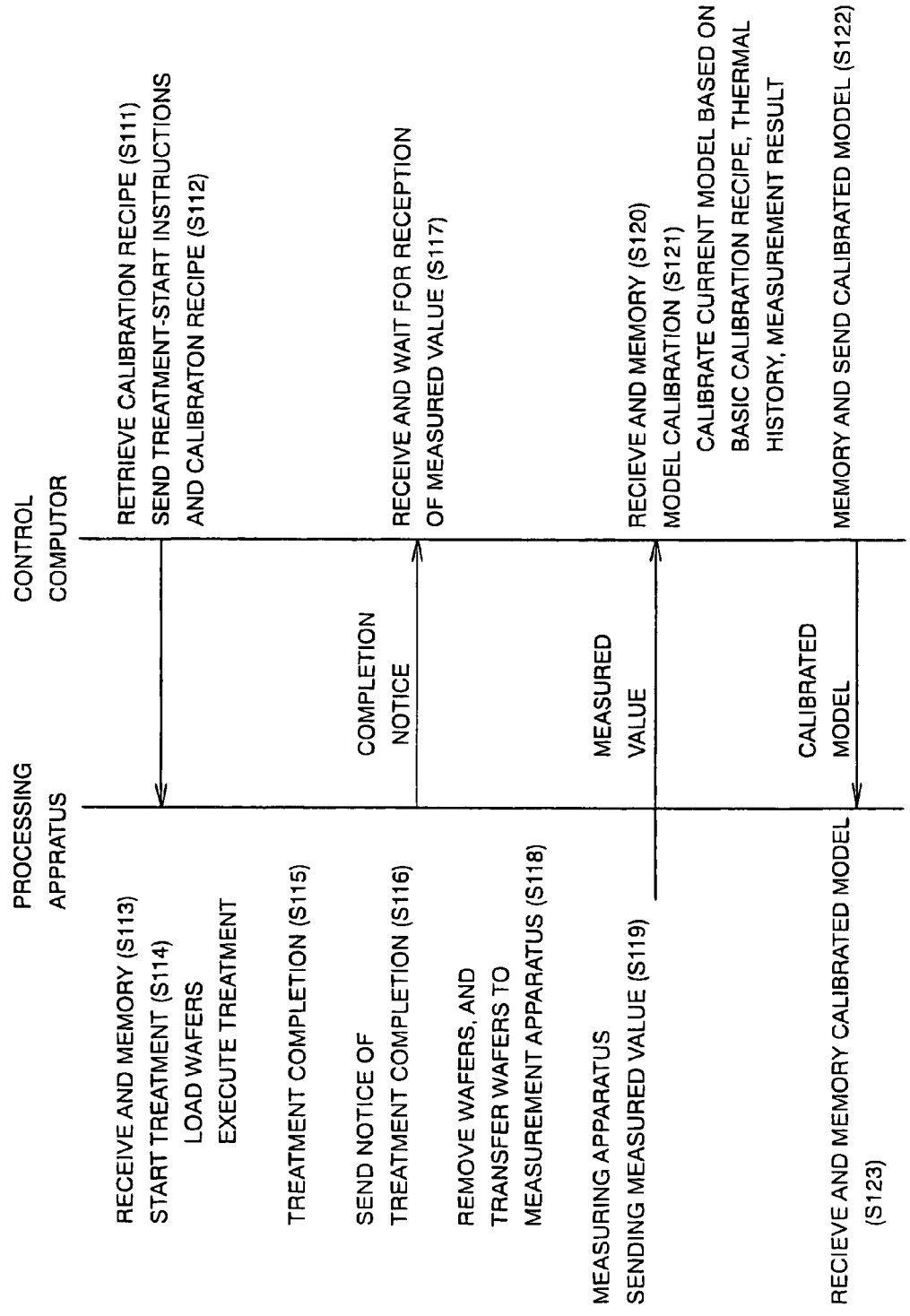
FIG. 9 is a chart for explaining a model calibration procedure.

The following operations are basically identical with the calibration procedure of the initial setting as shown in FIG. 9. The control computer 7 performs the calibration of the model as follows (step S23). The control computer 7 retrieves the recipe for calibrating the processing apparatus 3 to be calibrated from the memory section 76 (step S111), and sends an instruction for starting the calibration of the model and also sends the recipe for calibration to the processing apparatus 3 to be calibrated (step S112). The processing apparatus 3 receives the instruction and the recipe for calibration from the control computer 7, and stores the recipe for calibration in the recipe storage section 412*b* (step S113). Then, the processing apparatus 3 to be calibrated performs a film-forming treatment according to the recipe for calibration stored in the recipe storage section 412*b* (step S114).

When the film-forming process is completed (step S115), the control section 411 sends a notification of the completion of the film-forming treatment to the control computer 7 (step S116). The control computer 7 receives the notification, and waits for receiving a measurement result from the measuring apparatuses (step S117).

The person in charge of treatment sets the processed wafers W in the measuring apparatuses 5, and designates the apparatus-ID of the processing apparatus 3, and the treatment result is measured. The measuring apparatuses 5 send the measured film thickness and the apparatus-ID to the control computer 7 (step S119).

The control section 71 of the control computer 7 receives the film thickness thus sent (step S120), and performs the calibration of the model (step S121). The control section 71 overwrites the calibrated model in a model area for the processing apparatus 3 in the management table in the apparatus-DB 75, and sends the calibrated model to the processing apparatus 3 to be calibrated (step S122).

The processing apparatus 3 receives the calibrated model and overwrites the same in the model storage section 412*a*.

Figure 12:
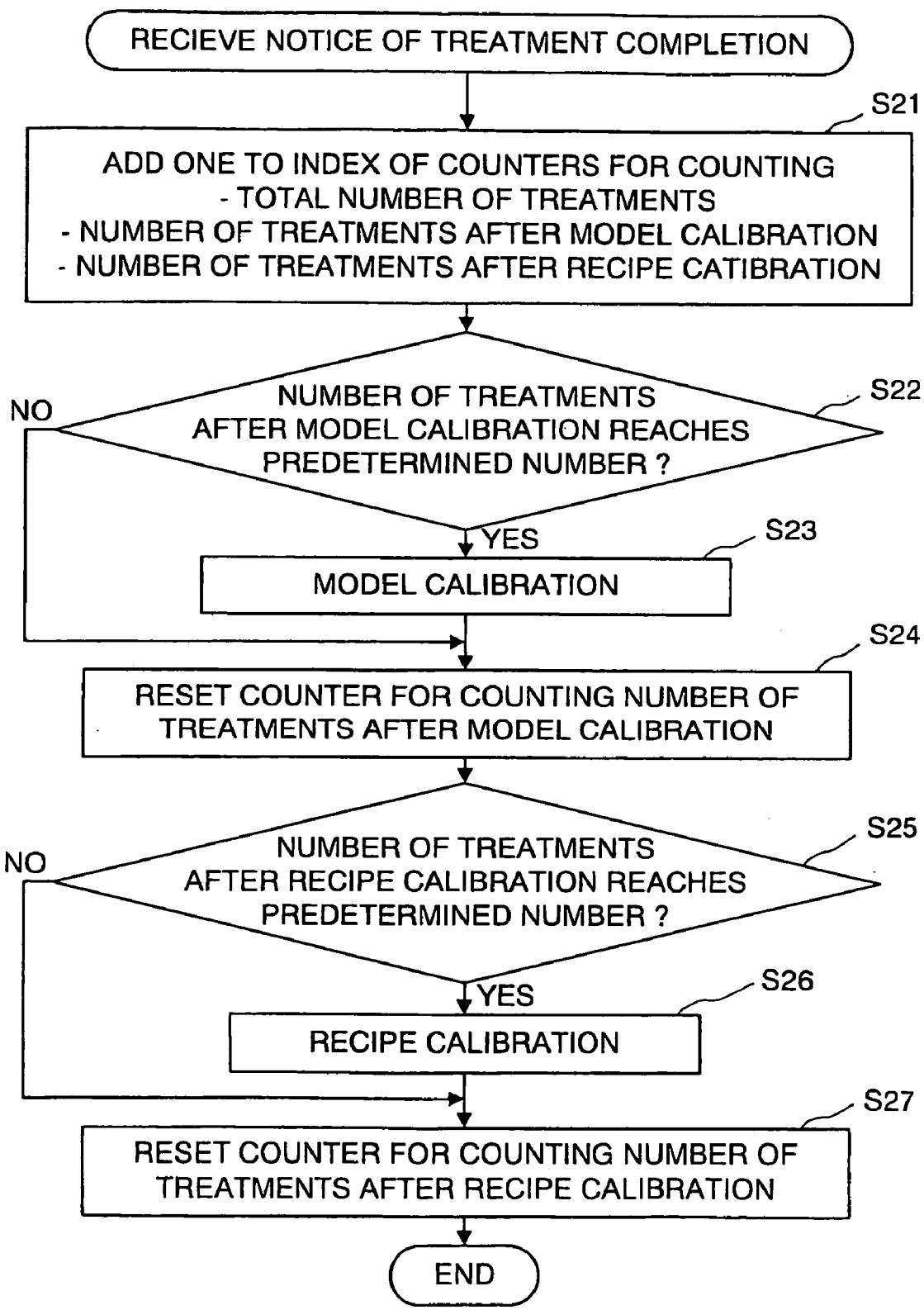
FIG. 12 is a chart for explaining a procedure performed by the control computer in response to a notification of completion of treatment which a processing apparatus outputs when it completes a treatment.

Upon completion of the above calibration, the control computer 7 resets the column of the number of treatments after the calibration of the model for the processing apparatus in the management table recorded in the apparatus DB 75 to be zero (FIG. 12, Step S24).

Then, the control section 71 judges whether or not the number of treatments performed by the apparatus after the calibration of the recipe stored in the management table reaches a predetermined value (step S25).

If it does not reach the predetermined value, the control section 71 completes the processing to be performed in response to the notification of the completion of the treatment. If it reaches the predetermined value, the control section 71 judges that the recipe for the processing apparatus 3 must be calibrated, and informs the operator of the need for the calibration via the display section 73.

Figure 10:
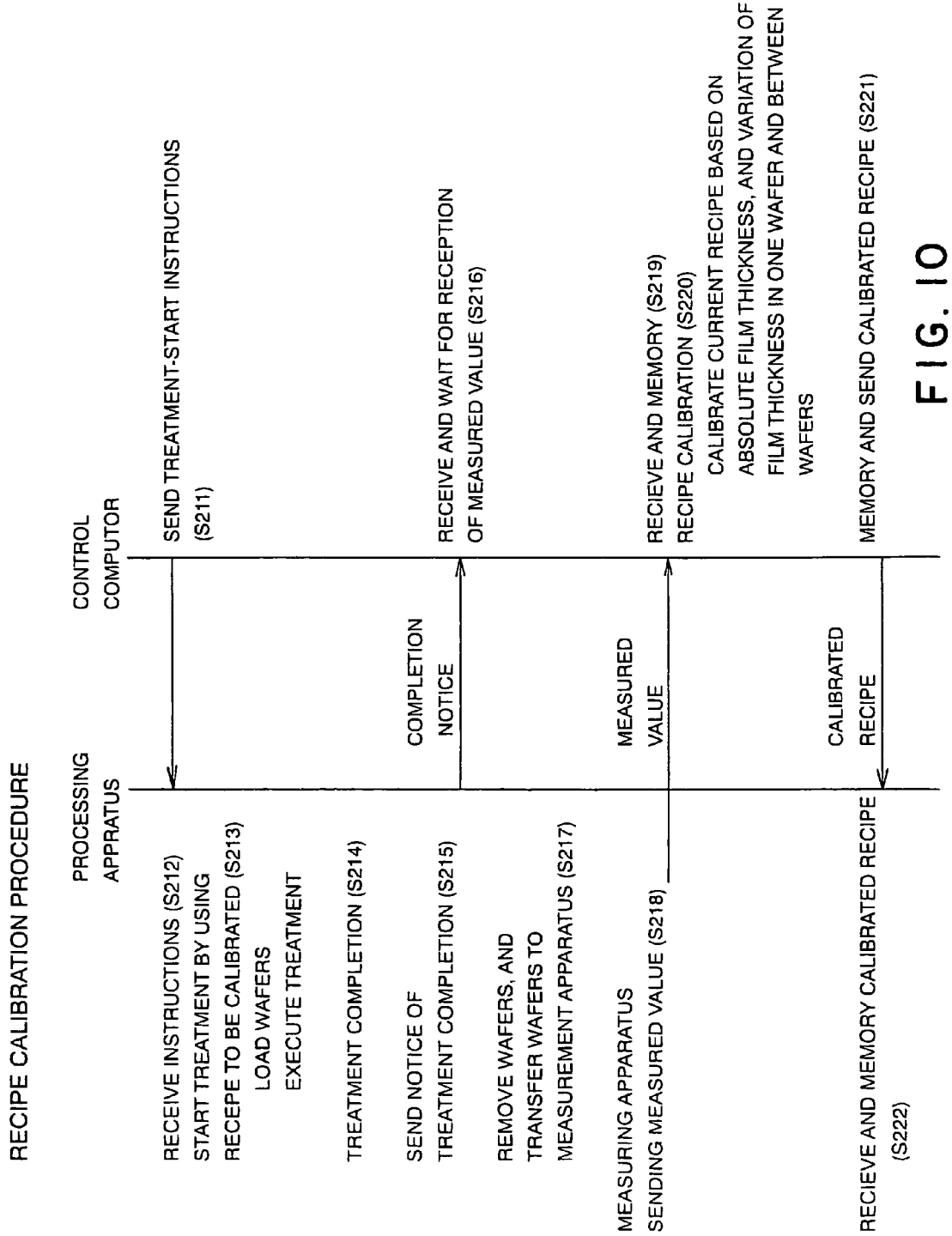
FIG. 10 is a chart for explaining a recipe calibration procedure.

The following operations are basically identical with the recipe calibration procedure in the initial setting shown in FIG. 10. The control computer 7 performs the calibration of the recipe as follows (step S26). The control section 71 of the control computer 7 sends an instruction for starting the calibration of the recipe to the processing apparatus 3 to be calibrated (step S211).

The processing apparatus 3 receives the instruction from the control computer 7 (step S212), and then performs a treatment according to the recipe for calibration stored in the recipe storage section 412*b* (step S213).

Upon completion of the treatment, the control section 411 sends a notification of the completion of the film-forming treatment to the control computer 7 (step S214). The control computer 7 receives the notification, and waits for receiving a measurement result from the measuring apparatuses 5 (step S216).

The person in charge of treatment sets the treated or processed wafers W in the measuring apparatuses 5, and designates the apparatus-ID of the processing apparatus 3 to measure the treatment result. The measuring apparatuses 5 send a measured film thickness and the apparatus-ID to the control computer 7 (step S218). The wafers W to be measured, and the positions and the number of the measuring points are identical with those designated at the initial setting.

The control section 71 retrieves the currently stored recipe of the processing apparatus 3 to be calibrated from the management table. Based on the measured values, the control section 71: (1) calibrates the recipes for all the zones such that the average film thickness of all the wafers W is equal to the target film thickness; (2) calibrates each recipe for each zone such that the average film thickness of a wafer W in each zone is equal to the target film thickness; and (3) calibrates each recipe for each zone such that the film thickness difference between the wafers W is reduced and the film thickness distribution in each wafer W is narrowed (step S220).

In this way, the control computer 7 calibrates the recipe of the processing apparatus 3, overwrites the same in the recipe storage area for the corresponding processing apparatus in the management table recorded in the apparatus-DB 75, and sends the calibrated recipe to the processing apparatus 3 to be calibrated (step S221).

The processing apparatus 3 receives the calibrated recipe and stores the same in the recipe storage section (step S222).

Upon completion of the above calibration, the control computer 7 resets the column of the number of treatments after the calibration of the recipe for the processing apparatus in the management table recorded in the apparatus DB 75 to be zero (FIG. 12, step S27).

As described above, the processing system 1 performs a centralized control of the plurality of processing apparatuses 3 by means of the control computer 7. Thus, the management of the apparatuses is significantly promoted as compared with the conventional management method. As the control computer 7 handles high-load data processing such as the calibration of the model and the calibration of the recipe, structures of software and hardware of each processing apparatus 3 can be simplified. In addition, due to the aforementioned calibration procedure, the treatment can be properly performed and a desired quality can be obtained.

The present invention is not limited to the above embodiment, and various modifications and applications are possible. For example, in the above embodiment, a treatment is carried out and then a model is calibrated based on the treatment result. However, for example, dummy wafers having thermo sensors incorporated therein may be placed in the respective zones, and the temperature of each wafer may be directly measured and recorded. Then, the model may be calibrated so that the measured actual temperature coincides with the temperature which is estimated by using the model.

In the above embodiment, the model and the recipe are calibrated by performing a treatment exclusively for the calibration, every time when designated number of treatments has been carried out. However, it is possible to calibrate the model or the recipe, while performing a usual process. For example, in performing a usual process, dummy wafers having thermo sensors incorporated therein and product wafers are positioned in the respective zones, and the temperature of each wafer may be directly measured and recorded. Then, the control computer 7 may calibrate the model so that the temperature estimated by using the model coincides with the measured actual temperature, and renews the model of the processing apparatus 3 before the next treatment starts.

Wafers W may be sampled from the product wafers subjected to a usual treatment in each zone. The film thickness of each sample wafer may be measured, and then the control computer 7 may calibrate the model by using the measured value, and may renew the model or recipe of the processing apparatus 3 before the next treatment starts. According to this method, it is possible to calibrate the model and the recipe without halting the processing apparatus 3.

Figure 13:
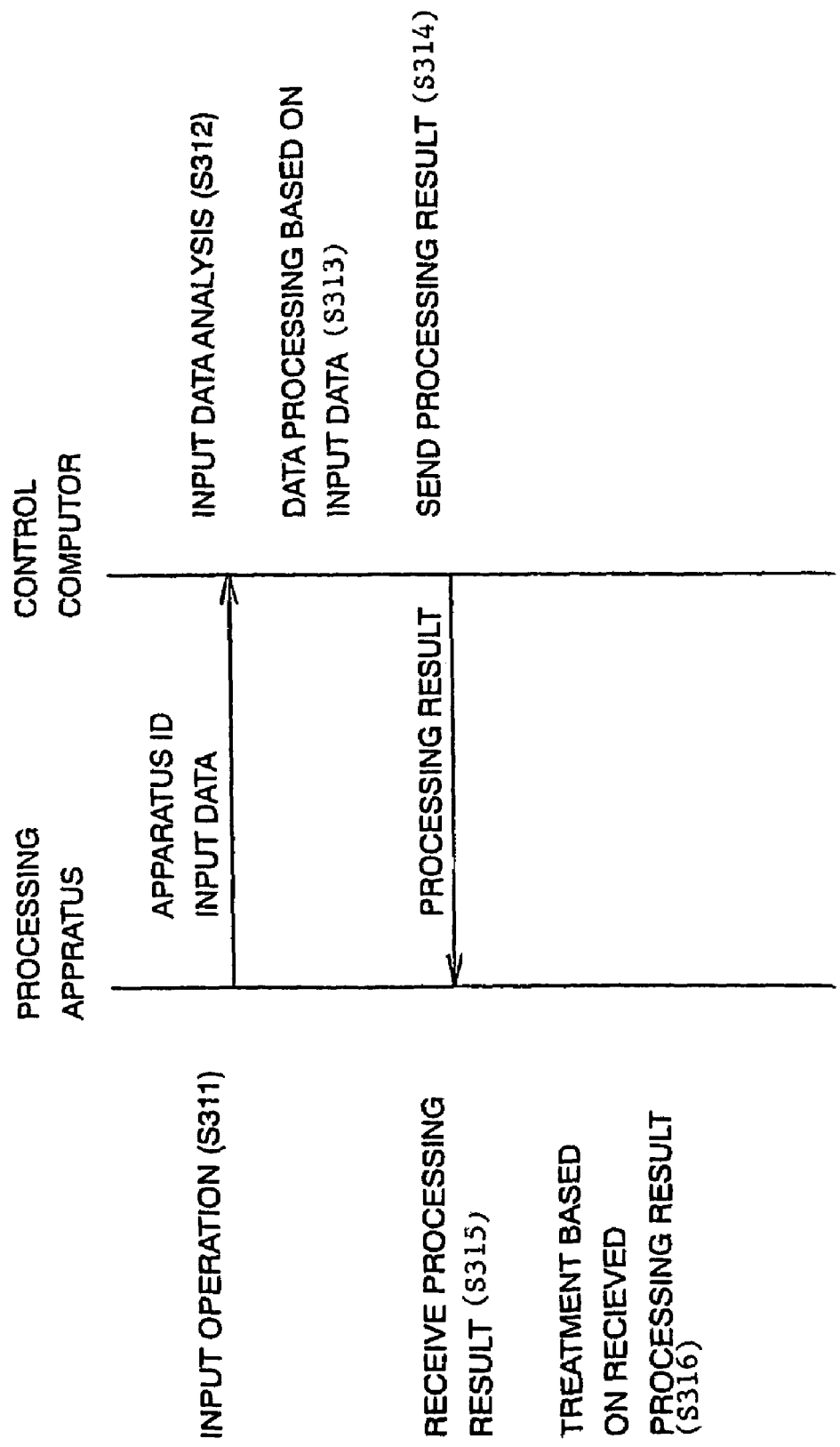
FIG. 13 shows another operation of the processing system.

In the above embodiment, although the control computer 7 calibrates the model and the recipe, the control computer 7 can perform other data processing. For example, a certain computing function possessed by the plurality of processing apparatuses may be assigned to the control computer 7. As shown in FIG. 13, when the person in charge of treatment operates the control panel 414 (see, FIG. 4) of the processing apparatus 3 to input any given data, the data and the apparatus-ID are sent to the control computer 7 through the LAN 9 (step S311). The control computer 7 analyzes the inputted data (step S312), and performs data processing based on the inputted data (step S313) (data processing such as computing operation for changing the settings of the apparatus). The result is returned to the processing apparatus 3 (Step S314). The data received by the processing apparatus 3 (Step S315) are utilized to change the settings of the processing apparatus 3 or to control the processing apparatus (Step S316), and are displayed on the control panel 414. Also in this case, constitutions of the respective apparatuses can be simplified. In addition, the person in charge of treatment can operate the respective processing apparatuses without being aware of the existence of the control computer.

In the above embodiment, the measuring apparatuses are separated from the processing apparatuses 3. However, the measuring apparatus 5 may be incorporated in the processing apparatus 3. According to this, the measurement result for the object to be treated by the measuring apparatus 5 can be sent from the processing apparatus 3 to the control computer through the LAN 9. When sending the treatment result, an apparatus-ID can automatically be attached to the treatment result data, which further saves labor.

In the above embodiment, although the LAN 9 is exemplified as a communication medium, the constitution of the communication means is optionally determined. For example, it is possible to communicate data and instructions among the apparatuses through a record medium such as a flexible disc and a flash memory.

In the above embodiment, although a semiconductor wafer is exemplified as an object to be treated, the object may be a liquid crystal display element and a glass substrate of PDP.

The invention claimed is:

1. A processing system comprising:
  a plurality of processing apparatuses, each processing apparatus including:
    treatment means for treating an object according to a predetermined recipe, a heating furnace adapted to contain and heat the object, and a plurality of thermal sensors arranged to sense temperature at their respective positions and provide signals indicative thereof,
    memory means for storing control data defining a model and a recipe for controlling the treatment means, the model providing an estimate of temperature of the object based on signals from the thermal sensors, and a recipe defining a desired change in temperature of the object during treatment,
    control means for controlling the treatment means according to the control data stored in the memory means so that the object is treated according to the recipe, the control means being configured to
      estimate the temperature of the object based on the outputs of the thermal sensors by using the model, and control the heating furnace based on the estimated temperature so that the temperature of the object changes according to the recipe; and means for independently communicating with a computer system separate and apart from each of the other processing apparatuses by receiving control data and transmitting to the computer system data indicative of treatment;

a computer system arranged separate and apart from the processing apparatuses and adapted to communicate with each processing apparatus, data including the control data and data indicative of treatment results, the computer system including calibration means for calibrating the control data for each processing apparatus based at least in part on a result of a treatment of an object performed by the processing apparatus, the computer system being constructed and arranged to calibrate the model when a model for one of the processing apparatuses is to be used and calibrated according to the following process:

sending a calibrating recipe for calibrating a model to a processing apparatus;

causing the processing apparatuses to treat an object according to the calibrating recipe for calibrating the model; and calibrating the model by the calibration means based on a result of the treatment of the object.

2. The processing system according to claim 1, wherein:

the computer system includes memory means for storing control data corresponding to each of the control data stored in the memory means of each of the processing apparatuses; and the computer system is configured to perform a procedure, when calibrating the control data for one of the processing apparatuses, the procedure including the steps of:

retrieving the control data for said one of the processing apparatuses stored in the memory means of the computer system;

calibrating the retrieved control data based on a result of a treatment of the object performed by said one of the processing apparatuses;

storing the calibrated control data in the memory means of the computer system; and sending the calibrated control data to said one of the processing apparatuses, and causing the memory means of said one of the processing apparatuses to store the calibrated control data.

3. The processing system according to claim 1, further comprising a measuring apparatus adapted to measure a result of a process performed by the processing apparatus, wherein the computer is configured to communicate data with the measuring apparatus, whereby the result of the treatment is inputted into the computer.

4. The processing system according to claim 1, wherein the computer system is configured to calibrate the model based on a measurement of an actual temperature of the object during the treatment being performed.

5. The processing system according to claim 1, wherein:

each of the processing apparatuses is configured to send a notification of completion of a process of the object to the computer system; and the computer system is configured to count a number of treatments performed by each of the processing apparatuses according to the notification, and configured to correct the control data at every time when a designated number of treatments has been performed by each of the processing apparatuses after last calibration of the control data.

6. The processing system according to claim 1, wherein:

the processing apparatus has means for requesting the computer to perform a data processing;

the computer system includes means for performing the data processing in response to a request received from the processing apparatus, and for sending a result of the data processing to the processing apparatus; and the processing apparatus includes means for receiving the result of the data processing sent from the computer, and for operating according to the result of the data processing thus received.

7. The processing system according to claim 1, wherein each of the processing apparatuses includes measuring means for measuring a result of a treatment of the object performed by each of the processing apparatuses, and wherein a result of a measurement by the measuring means is capable of being sent from each of the processing apparatuses to the computer through the communication medium.

* * * * *